(12) United States Patent
Hill (10) Patent No.: US 6,198,295 B1
(45) Date of Patent: Mar. 6, 2001

(54) APPARATUS AND METHOD FOR DETECTING ELECTRICAL RESISTANCE CHANGE IN CONNECTORS TO A REMOTE MOUNTED SENSOR

(75) Inventor: Bruch Lyman Hill, Roseville, MN (US)

(73) Assignee: Honeywell Inc., Minneapolis, MN (US)

( * ) Notice: Subject to any disclaimer, the term of this patent is extended or adjusted under 35 U.S.C. 154(b) by 0 days.

(21) Appl. No.: 09/225,462

(22) Filed: Jan. 6, 1999

(51) Int. Cl.[7] .............................. G01R 27/26; F23N 1/08
(52) U.S. Cl. ........................................ 324/711; 236/20 R
(58) Field of Search ................................... 324/711, 133, 324/677, 441; 236/20 R (56) References Cited

U.S. PATENT DOCUMENTS

| | | |
|---|---|---|
| 3,711,850 | 1/1973 | Kelly . |
| 3,750,146 | 7/1973 | Lucas . |
| 3,836,847 | 9/1974 | Lucas . |
| 4,217,542 | 8/1980 | Abbe et al. . |
| 4,242,631 | 12/1980 | Hall . |
| 4,841,458 * | 6/1989 | Levine et al. .......................... 324/557 |
| 5,189,376 | 2/1993 | Roberge et al. . |
| 5,657,238 * | 8/1997 | Lindeboom ............................ 324/677 |
| 5,748,429 | 5/1998 | Peterson . |
| 5,874,825 * | 2/1999 | Daniele ................................. 324/441 |

* cited by examiner

Primary Examiner—Safet Metjahic
Assistant Examiner—James C Kerveros
(74) Attorney, Agent, or Firm—Merchant & Gould P.C.

(57) ABSTRACT

A control system detects an electrical resistance change in a connector coupling a remote mounted temperature sensor to a control system. A control system determines the resistance of the sensor or the connector by selectively charging or discharging a capacitor through a unidirectional circuit element or the sensor. The control system is disclosed as controlling a water heater system, although such control systems may be used to control other systems using remote mounted sensors. A calibrating circuit is used to measure a transient response of an RC circuit, from which resistance can be derived.

22 Claims, 4 Drawing Sheets

APPARATUS AND METHOD FOR DETECTING ELECTRICAL RESISTANCE CHANGE IN CONNECTORS TO A REMOTE MOUNTED SENSOR

CROSS REFERENCE TO RELATED APPLICATIONS

This application is related to the subject matter of U.S. patent application Ser. No. 09/266,371, filed Jan. 6, 1999, entitled "APPARATUS AND METHOD FOR PROVIDING A MULTIPLE OPTION SELECT FUNCTION", which is specifically incorporated herein by reference for all that it discloses and teaches.

BACKGROUND OF THE INVENTION

1. Field of the Invention

The present invention relates generally to electrical systems and devices, and more particularly to apparatus and methods for detecting resistance changes in connectors to a remote mounted sensor.

2. Description of Related Art

In a typical water heater control system, a remote mounted sensor is used to detect water temperature inside a water heater tank. In some systems, the remote mounted sensor is a Positive Temperature Coefficient (PTC) or Negative Temperature Coefficient (NTC) thermistor. Generally, a thermistor is a temperature sensitive passive semiconductor that exhibits a large change in electrical resistance when subjected to a relatively small change in temperature. The resistance of a PTC thermistor goes up as the temperature increases; whereas the resistance of an NTC thermistor goes down as the temperature increases. Such a sensor can be electrically connected to a microcontroller that monitors the resistance of the thermistor, converts the resistance to a corresponding water temperature value in accordance with the positive or negative relationship of resistance to temperature, and adjusts the water heater operation to maintain the water temperature within a desired range.

In some systems, the remote sensor is electrically connected to the microcontroller by way of a quick connection means. Over time, such connection means can corrode, thereby increasing in resistance. The increased resistance of the connector translates to an increase in the overall resistance detected by the microcontroller, ultimately corrupting the accuracy of the temperature detection function. For example, in a sensor comprising a PTC thermistor, an increase in the resistance of the connector would cause the microcontroller to detect a temperature that is higher than that actually sensed by the thermistor. In contrast, an increase in the resistance of the connector in an NTC thermistor circuit would cause the microcontroller to detect a temperature that is lower than that actually sensed by the thermistor. As a result, the accurate temperature detection and control of the water temperature are compromised by the increased resistance of the connector. In particular, in the case of an NTC thermistor circuit, such an increased resistance would tend to cause the microcontroller to unnecessarily increase the water temperature. For safety reasons, it is generally preferable to avoid unintended increases in temperature.

One approach for checking a temperature sensing circuit is addressed in U.S. Pat. No. 5,768,429 to Peterson. The object of the invention in Peterson is to provide a temperature sensing circuit having a safe failure mode and employing resistive temperature sensors suitable for high limit heating plant temperature detection. In Peterson, a temperature sensing circuit is described as including two switches and parallel NTC and PTC thermistors, where the NTC thermistor is also coupled in series with a diode. Failure of one of the resistive temperature sensors may be detected by monitoring charging and discharging time constants associated with the resistive temperature sensors. A failure is evidenced by a dramatic change in the ratios of the time constants. During discharge, if the diode is reverse biased, current flows through one thermistor, and if the diode is forward biased, current flows through both thermistors. Peterson does not, however, disclose or suggest determining or detecting a change in, a connector resistance of a connector coupling a remote mounted thermistor to a microcontroller.

Therefore, need exists for a means of detecting changes in resistance of the connectors to a remote mounted sensor. Furthermore, need exists for a means of determining the accurate resistance of the a remote mounted sensor, notwithstanding changes in connector resistance.

SUMMARY OF THE INVENTION

In accordance with this invention the above problems have been solved by a method for detecting a measured connector resistance in a connector coupling a remote mounted sensor to a microcontroller and a capacitor. The connector has an initial predetermined resistance, and the method begins by coupling a unidirectional current element to the microcontroller and the capacitor via the connector and in parallel with the remote mounted sensor. A first transient response associated with the capacitor is determined when current flows substantially through the unidirectional current element and the connector and substantially bypasses the remote mounted sensor. The measured connector resistance is determined from the first transient response.

In another feature of the invention a resistance change is detected by detecting a difference between the predetermined resistance and the measured connector resistance. If the difference exceeds a predetermined threshold, an error indicating derogation of the connector is flagged.

In another feature of the invention, a second transient response is determined. This transient response is also associated with the capacitor but is characterized by current substantially flowing through the remote mounted sensor and the connector and substantially bypassing the unidirectional current element. A sensor resistance is determined from a difference between the measured connector resistance and a measured sensor resistance determined from the second transient response.

The invention can also be implemented by an apparatus or device for detecting electrical resistance as seen by a control circuit looking into connectors connecting a remote circuit to the control circuit. The device includes a unidirectional current element, a non-linear passive element, and a microcontroller. The unidirectional current element is electrically connected in parallel with the remote circuit and across the connectors. The non-linear passive circuit element in the control circuit is coupled to the remote circuit and the unidirectional current element by one of the connectors. The microcontroller is coupled to both of the connectors. Through the one connector the microcontroller is also coupled to the non-linear passive circuit element.

The microcontroller is configured to perform a plurality of operations. First, it detects a response time of a transient signal across the non-linear passive circuit element. This response time results from a transient current flowing substantially through the connectors and only the unidirectional current element. Second, it determines a first resistance of the connectors and the unidirectional current element from the response time. Third, it compares the first resistance to a predetermined resistance for the connectors and the unidirectional current element to indicate a derogation in connectors.

As another feature of the invention the microcontroller is further configured to perform the following operations. It detects a second response time of a transient signal across the non-linear passive circuit element. The second response time results from a transient current flowing substantially through the connectors and only the remote circuit. The microcontroller determines from the second response time a second resistance corresponding to the resistance of the connectors and the remote circuit element. Last, the microcontroller subtracts the first resistance from the second resistance to determine a resistance for substantially only the remote circuit.

DETAILED DESCRIPTION OF THE PREFERRED EMBODIMENT

Embodiments of the invention described herein are generally implemented as logical operations in an intelligent controller in a control system. The logical operations of the present invention are implemented (1) as a sequence of steps directed by programs instructions running on an intelligent controller, and (2) as interconnected machine or circuit modules within the intelligent controller. The implementation is a matter of choice, dependent on the performance requirements of the intelligent controller implementing the invention. Accordingly, the logical operations making up embodiments of the present invention described herein are referred to variously as operations, steps, and modules.

Figure 1:
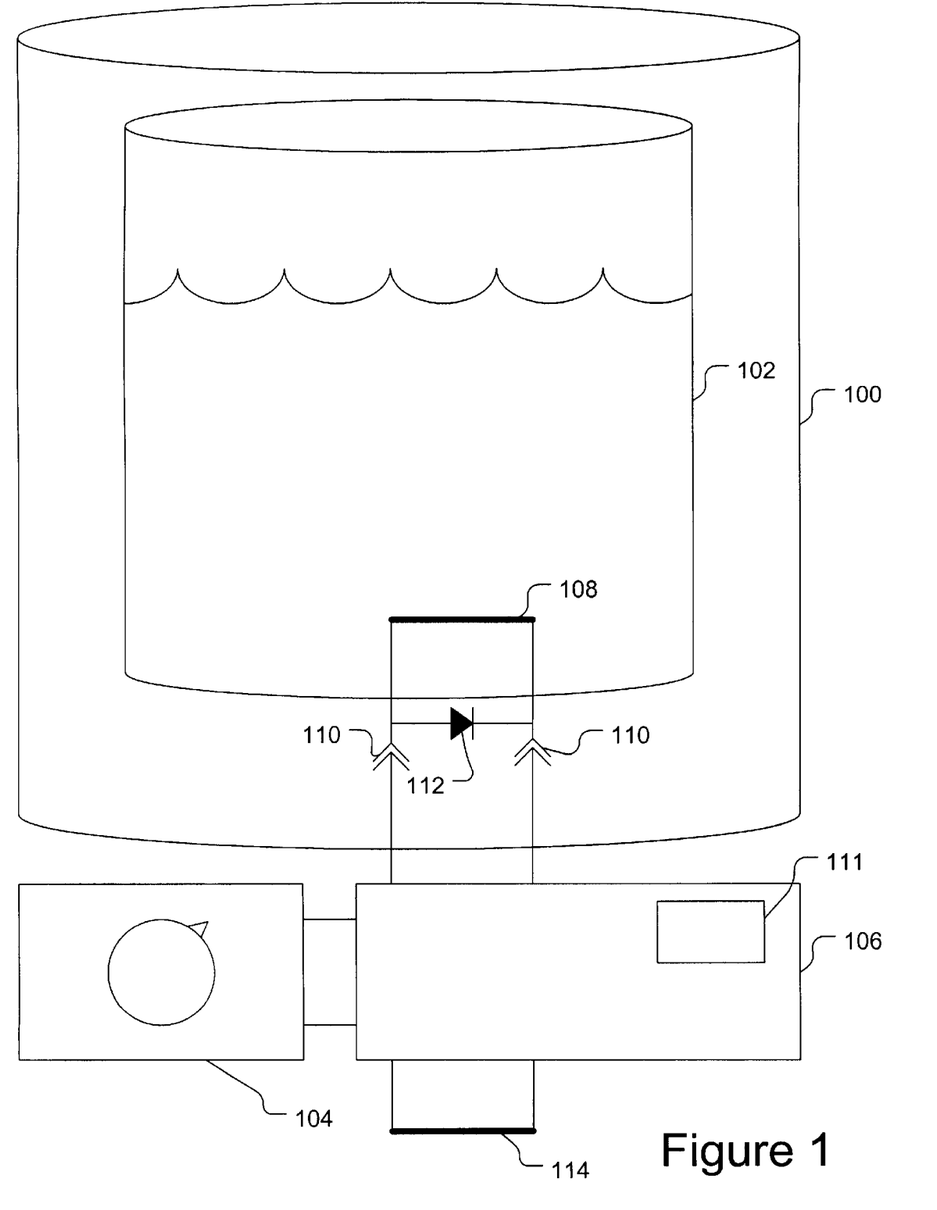
FIG. 1 depicts a water heater system in an embodiment of the present invention.

FIG. 1 depicts a water heater system in an embodiment of the present invention. An insulated water heater shell 100 encases an internal tank 102 that holds the water to be supplied into a building's water system. FIG. 1 also includes a microcontroller 106 that controls the operation of the water heater. In an exemplary embodiment of the present invention, the microcontroller 106 is a Motorola MC68HC705P6A, described in detail in Motorola 68HC705P6A General Release Specification, Rev. 1.0, Jul. 23, 1996, specifically incorporated herein by reference for all that it discloses and teaches. Other microcontrollers are also contemplated within the scope of this invention, including without limitation MC68HC05P4 microcontrollers from Motorola Inc.

The microcontroller 106 is coupled to a setpoint temperature control 104, which in an embodiment of the present invention includes a 10K linear potentiometer with a 20% tolerance. The setpoint temperature control 104 can be rotated by a consumer to set the desired temperature of the water in the tank 102. The setpoint temperature control 104 preferably provides a variable resistance across two pins of the microcontroller 106, which corresponds to a position parameter P. The position parameter P is then converted to a setpoint temperature at which the microcontroller 106 attempts to maintain the water inside the tank 102, increasing or decreasing the heat applied to the water inside the tank 102.

Also as illustrated in FIG. 1, a remote mounted sensor 108 is positioned to sense the temperature of the water contained within the tank 102. The sensor 108 is electrically connected in parallel with unidirectional current element 112 and remotely coupled to the microcontroller via a connector means 110. Typically, a resistance parameter representing the internal water temperature is monitored by the microcontroller 106, which increases or decreases the heat applied to the water in the tank in accordance with the desired setpoint temperature.

FIG. 1 also shows an option select resistor 114 coupled to the microcontroller 106. Typically, the option select resistor 114 is installed or modified in accordance with a customer's specification to select at least one operating characteristic from one or more sets of multiple options or option categories. The memory device 111 is preferably an internal read-only memory (ROM) device integrated within the microcontroller 106 that stores program instructions to control the microcontroller 106. An external memory could also be used in an embodiment of the present invention. Preferably, the memory device 111 also stores options to be selected by the option select resistor 114. It should be understood that multiple memory devices may also be used to store the program code and options.

Although FIG. 1 depicts a water heater control system, the present invention is not limited to water heaters. Other systems in which detecting and compensating for the resistance of connectors is desired, including without limitation furnaces and hydronic heating and cooling systems, may employ the apparatus and method of the present invention.

Figure 2:
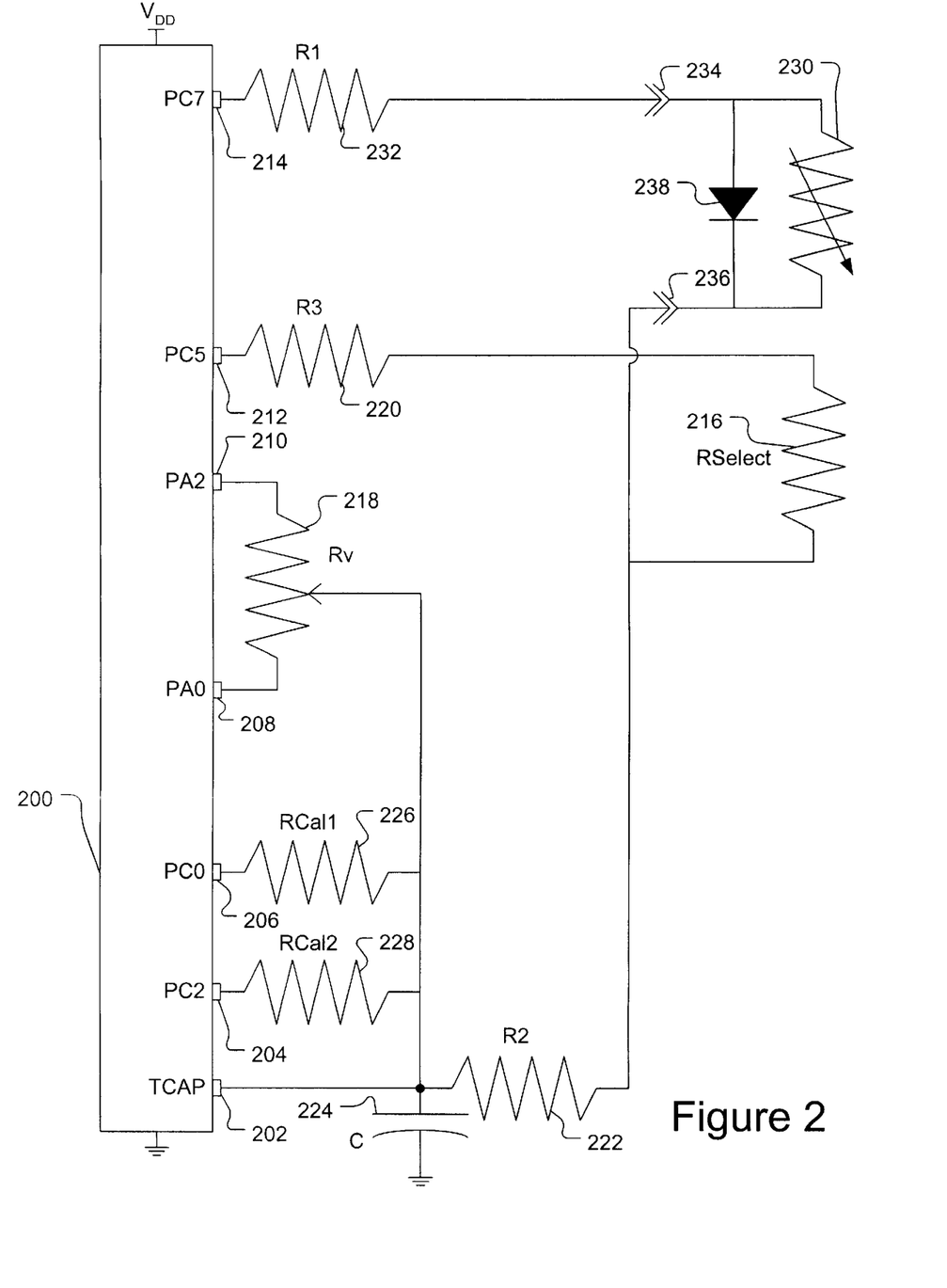
FIG. 2 depicts a schematic diagram of a circuit in an embodiment of the present invention.

FIG. 2 depicts a schematic diagram of a circuit in accordance with the present invention. A microcontroller 200 includes, among other ports, a capture timer (TCAP) pin 202, an I/O Port A having pins PA0–PA7, an I/O Port B having pins PB5–PB7, and an I/O Port C having pins PC0–PC7. Pin PA2 of I/O Port A is shown at 210 and pin PA0 of I/O Port A is shown at 208. Pin PC0 of I/O Port C is shown at 206, pin PC2 of I/O Port C is shown at 204, pin PC5 of I/O Port C is shown at 212, and pin PC7 of I/O Port C is shown at 214. The pins of I/O Port B are not shown.

Circuitry relating to the option select resistor 114 of FIG. 1, the temperature sensor 108 of FIG. 1, and the setpoint temperature control 104 of FIG. 1 is shown in FIG. 2. The option select resistor is represented in FIG. 2 as a resistor 216 having a resistance value of RSelect. The option select function is more fully disclosed in U.S. patent application No. 09/266,371, entitled "Apparatus and Method for Providing a Multiple Option Select Function" and filed Jan. 6, 1999, which is specifically incorporated by reference herein for all that it discloses and teaches.

A capacitor 224 having capacitance C is electrically connected between the TCAP port 202 and a ground potential. Preferably, a precision resistor 226 having a resistance of RCal1 and a precision resistor 228 having a resistance of RCal2 are coupled to pins 206 and 204 respectively and are individually coupled in series with the capacitor 224, as shown. In a preferred embodiment, RCal1 equals 10 KΩ and RCal2 equals 15 KΩ, each with a tolerance of 0.1%, and C equals 0.1 $\mu$F. The resistors 226 and 228 are used in a calibration circuit to calibrate the transient response of the capacitor 224. In an embodiment of the present invention, the option select circuit of FIG. 2 calibrates a transient response of an RC circuit including the capacitor 224 and one of the resistors 226 and 228. A transient response may include without limitation a fall time, relating to a discharging of the capacitor 224, or a rise time, relating to a charging of the capacitor 224. In a preferred embodiment, the transient responses of both the RC circuit including the resistor 226 and the RC circuit including the resistor 228 are calibrated.

The remote mounted sensor circuit, including without limitation the remote mounted thermistor 230, the unidirectional current element 238, the connectors 234 and 236, and the resistors 232 and 222 (used to protect against electrostatic discharge and electrical shorts), is used to sense the water temperature within the tank 102 of FIG. 1. The resistor 232 has a resistance of R1, and the resistor 222 has a resistance of R2. In a preferred embodiment, R1 and R2 equal 1.0 K$\Omega$ with tolerances of 1%. Preferably, the thermistor 230 is electrically connected in parallel with a unidirectional current element 238 (e.g., a diode, a switch, or a transistor) and remotely coupled to the microcontroller 200 and associated circuitry by means of connectors 234 and 236. Generally, the resistance of the thermistor 230 changes with temperature, and the microcontroller 200 employs a technique similar to that discussed with regard to FIG. 4 to determine changes in the resistance of the thermistor 230. The microcontroller 200 monitors such changes in temperature, relative to a setpoint temperature prescribed in the system, to increase or decrease the heat applied to the water within the tank 102.

As illustrated in FIG. 2, a variable resistor 218, preferably in the form of a rotary potentiometer, is configured to set the setpoint temperature of the water heater system. The microcontroller 200 preferably increases or decreases the heat applied to the water inside the tank in accordance with the difference between the sensed water temperature, which is monitored by the thermistor 230, and the water temperature setpoint, which is set by the variable resistor 218.

Figure 3:
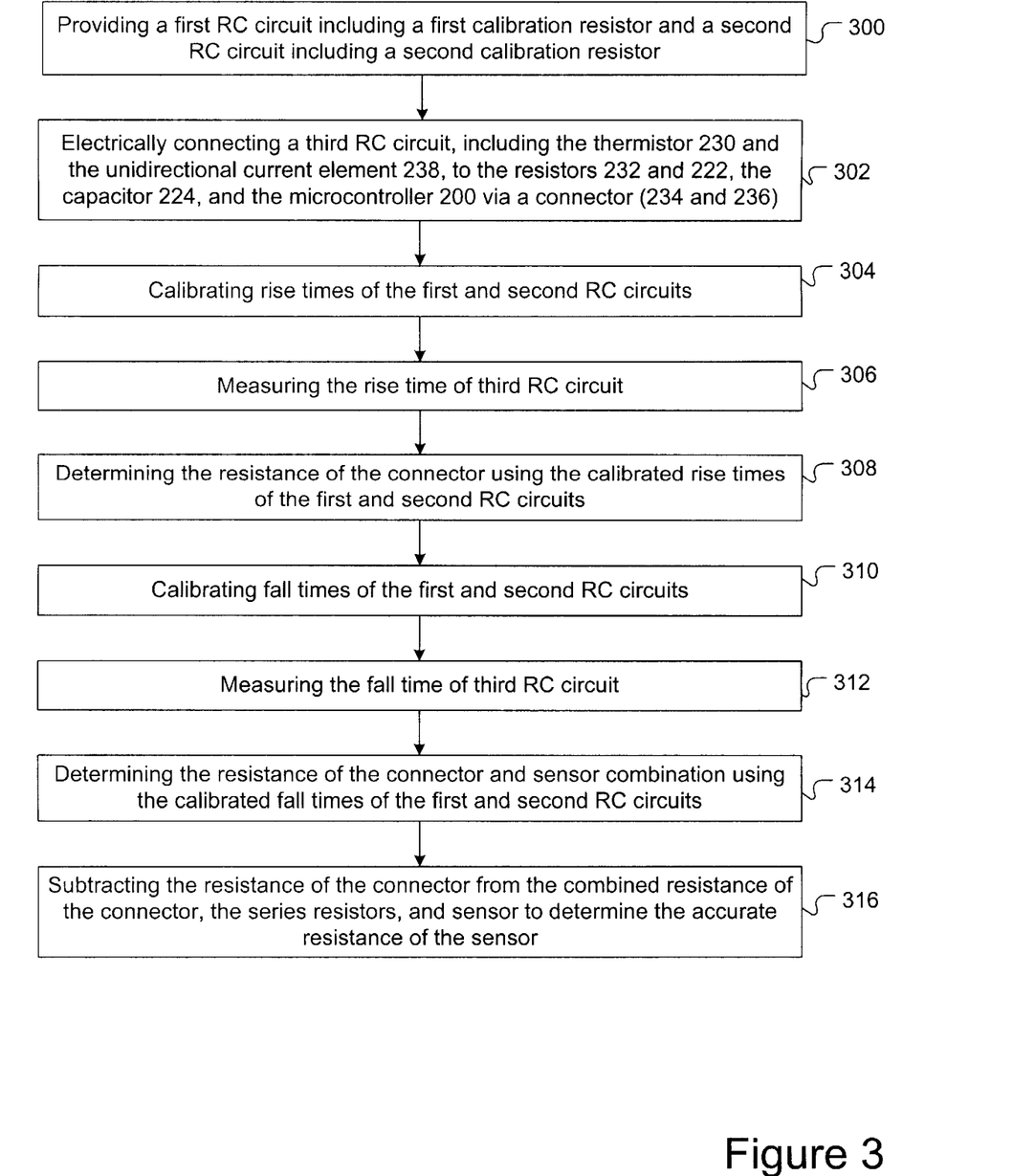
FIG. 3 depicts a flowchart illustrating a method for detecting a resistance in connectors and a sensor in an embodiment of the present invention.

FIG. 3 depicts a flowchart illustrating a method for detecting a resistance in connectors and a sensor in an embodiment of the present invention. Operation 300 provides a first RC circuit, preferably comprising the resistor 226 and the capacitor 224, and a second RC circuit, preferably comprising the resistor 228 and the capacitor 224. Operation 302 electrically connects a third RC circuit, preferably comprising the thermistor 230 coupled in parallel with the unidirectional current element 238, to the microcontroller 200, the resistors 232 and 222, and the capacitor 224 via the connectors 234 and 236, as shown. The parallel combination of the thermistor 230 and the unidirectional current element 238 comprise a remote mounted sensor net. In operation 304, the rise times of the first and second RC circuits are determined, as described with regard to FIG. 4.

Figure 4:
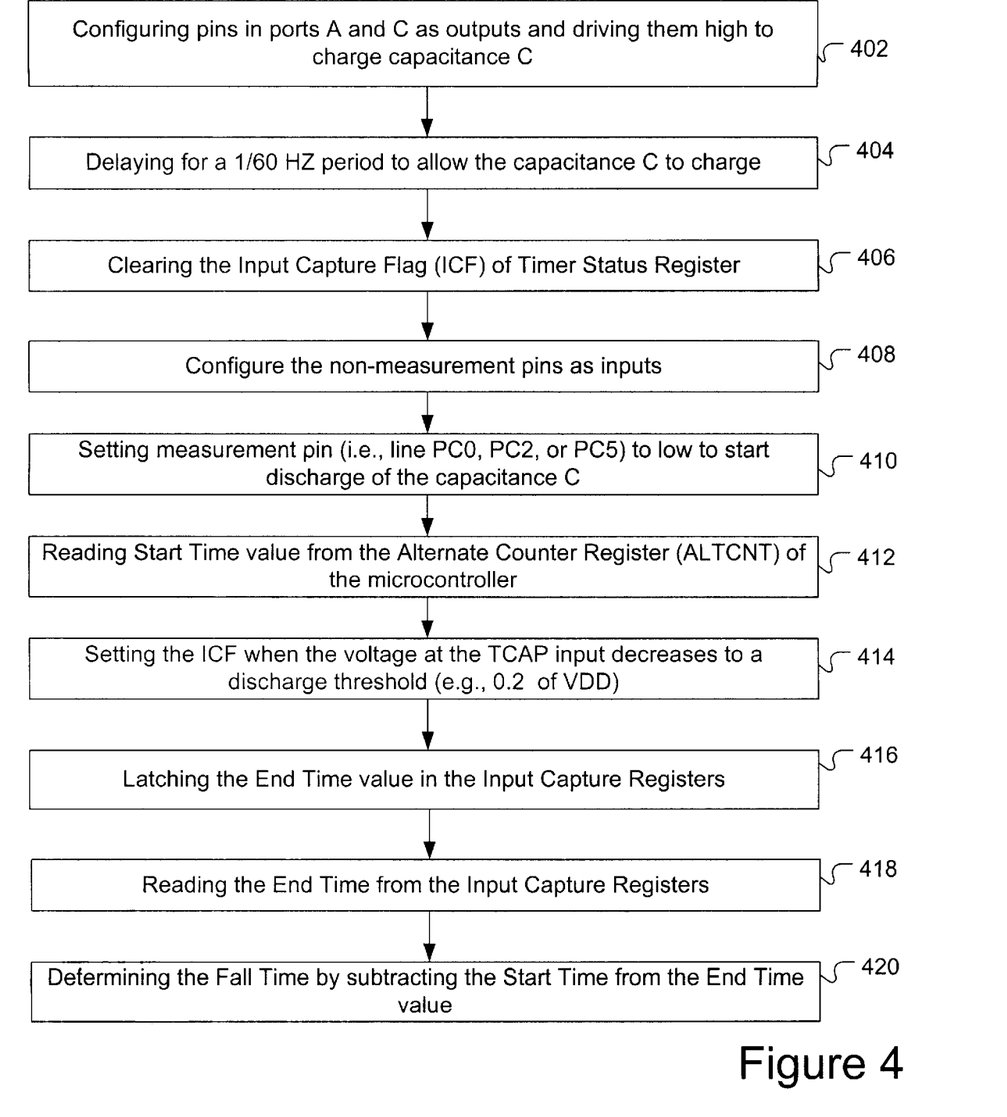
FIG. 4 depicts a flowchart illustrating a transient response measurement process in an embodiment of the present invention.

In operation 306, the rise time of the third RC circuit is determined, as described with regard to FIG. 4. It should be noted that, as the capacitor 224 of FIG. 2 is charged during the rise time, the current substantially flows through the unidirectional current element 238 (e.g., through a forward biased diode) and substantially bypasses the thermistor 230. In this direction of current flow, the resistance of the thermistor 230 is very much larger than the forward-biased diode 238 so substantially all the current flows through the diode. Accordingly, the rise time substantially characterizes the resistance of diode 238, connectors 234 and 236 (as well as the resistors 222 and 232), rather than the resistance of the thermistor 230.

Operation 308 determines the resistance of the connectors 234 and 236, the unidirectional current element 238, and the resistors 222 and 232, as described with regard to FIG. 4. In an embodiment of the present invention, the microcontroller 200 can monitor this resistance value, comparing it to a predetermined or initial resistance value for these elements. If the measure resistance value exceeds the predetermined resistance value by a predetermined magnitude, the microcontroller 200 can flag an error to indicate a failure of the sensor circuit caused by degradation of the connectors.

Alternately, the measured resistance value of the connectors 234 and 236, the unidirectional current element 238, and the resistors 222 and 232 can be used to maintain an accurate measurement of the thermistor resistance. As shown starting at operation 310, the fall times of the first and second RC circuits are determined, as described with regard to FIG. 4. Furthermore, the fall time of the third RC circuit is measured in operation 312. It should be noted that, as the capacitor 224 of FIG. 2 is discharged during the fall time, the current substantially flows through the thermistor 230 and substantially bypasses the diode 238 (e.g., bypassing a reverse biased diode). Current is inhibited from flowing through diode 238 because the resistance of the unidirectional current element 238 (e.g., the reverse-biased diode), is much larger than the resistance of thermistor 230 in this direction of current flow. Accordingly, the fall time substantially characterizes the resistance of the thermistor 230 and the connectors 234 and 236 as well as the resistors 222 and 232.

Operation 314 determines the resistance of the connectors 234 and 236, the thermistor 230, and the resistors 222 and 232, as described with regard to FIG. 4. In operation 316, the resistance determined in operation 308 is subtracted from the resistance determined in operation 314 to yield an accurate resistance value for the thermistor 230. As such, the microcontroller 200 can rely on this result to accurately control the water temperature within the tank 102 of FIG. 1.

FIG. 4 depicts a flowchart illustrating the fall time measurement process in a preferred embodiment of the present invention. Preferably, the timer input capture function of the MC68HC705P6A microcontroller is used to measure the transient response in operations 304, 306, 310 and 312 of FIG. 3. The rise and/or fall times of the capacitor 224 of FIG. 2 are captured and converted into resistance values corresponding to the enabled series resistor in the RC circuit. For example, in operation 304, the enabled series resistor in the first RC circuit is the resistor 226, which is connected in series with the capacitor 224 between the pin 206 and ground. The TCAP port is electrically connected to measure the voltage Vtcap across the capacitor 224.

In operation 402, pins coupled to the capacitor 224 (i.e., signals PC0, PC2, PC5, PC7, PA0, and PA2) are configured as outputs. If a fall time is being measured, the appropriate microcontroller pins are driven high to charge the capacitor 224 (i.e., capacitor C) prior to the discharging operation. Alternately, if a rise time is being measured, the appropriate microcontroller pins are driven low to discharge the capacitor prior to the charging operation. Operation 404 preferably delays for a 1/60 HZ period, or as long as required to fully charge or discharge the capacitor 224. Other preparatory operations (not shown) may also be required, such as clearing the Input Edge (IEDG) bit of the Timer Control Register to indicate that a high to low (associated with a fall time) signal transition triggers a capture at the TCAP port. Alternately, for rise time captures, the IEDG bit is set to indicate that a low to high signal transition triggers a capture. In operation 406, the Input Capture Flag (ICF) of the Timer Status Register is cleared.

In operation 408, the non-measurement pins are set as inputs (or tri-stated) to isolate the measurement pin and its corresponding resistor(s) and the capacitor 224. Operation 410 forces the measurement pin low to start the discharging of the capacitor 224. Alternately, for rise time, the measurement pin is forced high to start the charging of the capacitor 224. Concurrently, in operation 412, the Start Time, i.e., the start time of the discharge, is read from the Alternate Counter Register (ALTCNT) in the microcontroller 200. In operation 414, the microcontroller 200 sets the ICF bit when voltage at the TCAP port passes a threshold (e.g., 0.2 of VDD for fall times in the MC68HC705P6A). In a preferred embodiment, an interrupt service routine or another routine can poll the ICF to determine when the capture event has completed. In an alternate embodiment, a completed capture event may invoke a hardware or software interrupt that causes other processing to handle the completed event.

Concurrently with the setting of the ICF bit, operation 416 latches the End Time value in the Input Capture Registers, and operation 418 reads the End Time from the Input Capture Registers (high byte, then low byte). In operation 420, the fall time or rise time for the measurement pin is determined by subtracting the Start Time value from the End Time value. This process is preferably performed for the RCal1 and RCal2 resistances, as well as for the sensor and connector resistances, as described with regard to FIGS. 3 and 4.

The equation for discharging a capacitor through a resistor is:

$$V(t) = V_i * e^{-t/RC},$$

where $V(t)$ is the voltage across the capacitor as a function of time, $V_i$ is the initial voltage across the capacitor, and R and C are the resistance and capacitance in the RC circuit.

Likewise, the equation for charging capacitor through a resistor from a DC source voltage $V_s$ is:

$$V(t) = V_s * (1 - e^{-t/RC}),$$

To determine the resistance in an RC circuit having a known rise or fall time and a known capacitance, the rise or fall time of the RC circuit is converted to yield the resistance. In the case of a discharge of a fully charged capacitor, $V_{DD}$ can be substituted for $V_i$, Vtcap can be substituted for $V(t)$ when $t=T_f$ (i.e., the fall time):

$$T_f = -RC * \ln(V_{tcap}/V_{DD}).$$

Likewise, the rise time $T_r$ can be solved with:

$$T_r = -RC * \ln(1 - V_{tcap}/V_{DD}).$$

Although the unknown resistance can be solved from these equations if the fall time $T_f$ or rise time $T_r$ is known, the capacitance C in the circuit illustrated in FIG. 2 can vary up to 35% and $V_{tcap}$ can vary considerably for each device. Furthermore, the resistances of the ports in the circuit must also be considered. Therefore, it is preferably to use two precision resistors having resistances RCal1 and RCal2 for calibration purposes. When the measurement pins are isolated as discussed above:

$$T_{f\_Cal1} = (RCal1 + Rport_{Cal1}) * C * \ln(V_{tcap}/V_{DD}),$$

$$T_{f\_Cal2} = (RCal2 + Rport_{Cal2}) * C * \ln(V_{tcap}/V_{DD}),$$

$$T_{r\_Cal1} = (RCal1 + Rport_{Cal1}) * C * \ln(1 - V_{tcap}/V_{DD}), \text{ and}$$

$$T_{r\_Cal2} = (RCal2 + Rport_{Cal2}) * C * \ln(1 - V_{tcap}/V_{DD}).$$

By assuming $Rport_{Cal1}$ approximates $Rport_{Cal2}$ and by substituting $1/KCal_f$ for $C * \ln(V_{tcap}/V_{DD})$, the fall time equations combine to yield:

$$KCal_f = (RCal1 - RCal2)/(T_{f\_Cal1} - T_{f\_Cal2}).$$

Alternately, by substituting $1/KCal_r$ for $C * \ln(1 - V_{tcap}/V_{DD})$, the rise time equations combine to yield:

$$KCal_r = (RCal1 - RCal2)/(T_{r\_Cal1} - T_{r\_Cal2}).$$

By calibrating with two precision resistances RCal1 and RCal2, the variability of C, $V_{tCap}$, and the port resistances can be accommodated. Using the $KCal_f$ equation to solve for a third, unknown resistance, such as the resistance of the remote sensor and connectors, yields:

$$RSensor + RConnector = KCal_f(T_{f\_RSensor} - T_{f\_Cal1}) + RCal1, \quad (1)$$

where the resistance values R1 and R2 of FIG. 2 are assumed zero and $T_{f\_RSensor}$ equals the measured fall time of the RC circuit including the capacitor 224 and the thermistor 230 having an unknown resistance RSensor and the connectors 234 and 236 having a resistance RConnector.

Where R1 and R2 are non-zero, they may impact the fall time of the RSensor RC circuit, and their effect must be considered. That is, where R1 and R2 are non-zero:

$$RSensor + RConnector = KCal_f(T_{f\_RSensor} - T_{f\_Cal1}) + RCal1 - R1 - R2.$$

As illustrated in FIG. 2, the current resulting from the charging of capacitor 224 will substantially flow through the unidirectional current element 238 and the connectors 234 and 236 and substantially bypass the thermistor 230. Therefore, where the resistance values R1 and R2 of FIG. 2 are assumed zero and $T_{r\_RConnector}$ equals the measured rise time of the RC circuit including the capacitor 224 and the connectors 234 and 236 having an unknown resistance RConnector, the equations yield:

$$RConnector = KCal_r(T_{r\_RConnector} - T_{r\_Cal1}) + RCal1. \quad (2)$$

To determine an accurate measurement of RSensor, the RConnector value of equation (2) is subtracted from the combined resistance value of equation (1). If R1 and R2 are non-zero, their resistance contributions cancel out in the subtraction operation. To compensate for non-zero resistance of R1 and R2, it should be understood that reversing the orientation of the unidirectional current element 238 would preferably result in reversing the transient responses applied to the RConnector and RSensor measurements.

In an embodiment of the present invention, the thermistor 230 is a 100 KΩ NTC thermistor, although a PTC thermistor can also be used. The use of an NTC thermistor has advantages including lower cost and higher sensitivity.

In an alternate embodiment of the present invention, certain transient response measurements are made as described with regard to FIG. 4. However, instead of calculating resistance values for the associated circuit elements, the ratio of the transient responses is evaluated to determine if the connector's resistance has changed significantly or beyond a desired threshold. For example, in accordance with the description of FIG. 4, the rise time associated with the RC circuit that includes the resistor 226 (RCal1), referred to as $T_{r\_RCal1}$, and the rise time associated with the RC circuit that includes the connector (234 and 236) and the unidirectional current element 238, referred to as $T_{r\_RConnector}$, are measured. If the ratio of $T_{r\_RConnector}$ to $T_{r\_RCal1}$ exceeds a predetermined threshold, the control system determines that the connector resistance has increased beyond an acceptable level, and preferably issues an error signal to indicate a failure of the connectors. In a preferred embodiment, a predetermined threshold ratio is empirically established based on a model using a connector resistance of 3 KΩ. One advantage to this approach is that it requires fewer operations (e.g., a single calibration rise time is required) to detect a change in connector resistance.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method for detecting a measured connector resistance in a connector coupling a remote mounted sensor to a microcontroller and a capacitor, the connector having a predetermined resistance, the method comprising:
   coupling a unidirectional current element in parallel with the remote mounted sensor to form a remote mounted sensor net;
   coupling the remote mounted sensor net to the microcontroller and the capacitor via the connector to form an RC circuit including at least the remote mounted sensor net, the connector, and the capacitor;
   determining a first transient response associated with the RC circuit and being characterized by current substantially flowing through the unidirectional current element and the connector and substantially bypassing the remote mounted sensor; and
   determining the measured connector resistance in the connector from the first transient response.

2. The method of claim 1 further comprising:
   detecting a resistance change from a difference between the predetermined resistance and the measured connector resistance.

3. The method of claim 2 further comprising:
   indicating an error if the difference exceeds a predetermined threshold.

4. The method of claim 3 further comprising:
   determining a second transient response associated with the RC circuit and being characterized by current substantially flowing through the remote mounted sensor and the connector and substantially bypassing the unidirectional current element; and
   determining a sensor resistance in the remote mounted sensor from a difference between the measured connector resistance and a measured sensor resistance determined from the second transient response.

5. A device for detecting a resistance change of a connector as seen by a control circuit looking into the connector connecting a remote circuit to the control circuit, the device comprising:
   a unidirectional current element electrically connected in parallel with the remote circuit, the unidirectional current element and the remote circuit being coupled to the control circuit via the connector;
   a non-linear passive circuit element in the control circuit coupled to the remote circuit and the unidirectional current element via the connector, wherein the non-linear passive circuit element, the unidirectional current element, the remote circuit, and the connector form at least a portion of an RC circuit; and
   a microcontroller coupled to the connector and to the non-linear passive circuit element and being further coupled to the unidirectional current element via the connector, the microcontroller being configured to:
      detect a first response time of a first transient signal in the RC circuit and resulting from transient current flowing substantially through the connector and the unidirectional current element and bypassing substantially the remote circuit,
      determine a first resistance of the connector and the unidirectional current element based on the first response time, and
      compare the first resistance to a predetermined resistance for the connector and the unidirectional current element to detect a derogation in the connector.

6. The device of claim 5 wherein the microcontroller is further configured to:
   detect a second response time of a second transient signal in the RC circuit resulting from transient current flowing substantially through the connector and the remote circuit and bypassing substantially the unidirectional current element,
   determine from the second response time a second resistance corresponding to the resistance of the connector and the remote circuit, and
   subtract the first resistance from the second resistance to determine a resistance associated with the remote circuit.

7. The device of claim 5 wherein the remote circuit is a sensor changing resistance based on changes in a condition sensed by the sensor.

8. The device of claim 5 wherein the non-linear passive circuit element is a capacitor.

9. The device of claim 5 wherein the remote circuit is a thermistor changing resistance with a change in temperature of the thermistor.

10. The device of claim 5 wherein the unidirectional current element is a diode and the diode is forward-biased during determination of the first resistance and reverse-biased during determination of the second resistance.

11. A water heater control system comprising:
   a unidirectional current element electrically connected in parallel with a remote circuit, the unidirectional current element and the remote circuit being coupled to the control circuit via a connector;
   a non-linear passive circuit element in the control circuit coupled to the remote circuit and the unidirectional current element via the connector, wherein the non-linear passive circuit element, the unidirectional current element, the remote circuit, and the connector form at least a portion of an RC circuit; and
   a microcontroller coupled to the connector and to the non-linear passive circuit element and being further coupled to the unidirectional current element via the connector, the microcontroller being configured to:
      detect a first response time of a first transient signal in the RC circuit and resulting from transient current flowing substantially through the connector and the unidirectional current element and bypassing substantially the remote circuit,
      determine a first resistance of the connector and the unidirectional current element based on the first response time, and compare the first resistance to a predetermined resistance for the connector and the unidirectional current element to detect a derogation in the connector.

12. The water heater control system of claim 11 wherein the microcontroller is further configured to:
   detect a second response time of a second transient signal in the RC circuit resulting from transient current flowing substantially through the connector and the remote circuit and bypassing substantially the unidirectional current element,
   determine from the second response time a second resistance corresponding to the resistance of the connector and the remote circuit, and
   subtract the first resistance from the second resistance to determine a resistance associated with the remote circuit.

13. The water heater control system of claim 11 wherein the non-linear passive circuit element is a capacitor.

14. The water heater control system of claim 11 wherein the remote circuit is a thermistor changing resistance with a change in temperature of the thermistor.

15. The water heater control system of claim 11 wherein the unidirectional current element is a diode and the diode is forward-biased during determination of the first resistance and reverse-biased during determination of the second resistance.

16. Apparatus for detecting a measured connector resistance in a connector coupling a remote mounted sensor to a microcontroller and a capacitor, the connector having a predetermined resistance, the apparatus comprising:
   means for coupling a unidirectional current element in parallel with the remote mounted sensor to form a remote mounted sensor net;
   means for coupling the remote mounted sensor net to the microcontroller and the capacitor via the connector to form an RC circuit including at least the remote mounted sensor net, the connector, and the capacitor;
   means for determining a first transient response associated with the RC circuit and being characterized by current substantially flowing through the unidirectional current element and the connector and substantially bypassing the remote mounted sensor; and
   means for determining the measured connector resistance in the connector from the first transient response.

17. The apparatus of claim 16 further comprising:
   means for detecting a resistance change from a difference between the predetermined resistance and the measured connector resistance.

18. The apparatus of claim 16 further comprising:
   means for determining a second transient response associated with the RC circuit and being characterized by current substantially flowing through the remote mounted sensor and the connector and substantially bypassing the unidirectional current element; and
   means for determining a sensor resistance from a difference between the measured connector resistance and a measured sensor resistance determined from the second transient response.

19. A method for detecting a resistance change in a connector coupling a remote mounted sensor to a microcontroller and a capacitor, the method comprising:
   coupling a unidirectional current element in parallel with the remote mounted sensor to form a remote mounted sensor net;
   coupling the remote mounted sensor net to the microcontroller and the capacitor via the connector to form an RC circuit including at least the remote mounted sensor net, the connector, and the capacitor;
   determining a first transient response associated with the RC circuit and being characterized by current substantially flowing through the unidirectional current element and the connector and substantially bypassing the remote mounted sensor;
   determining a second transient response associated with the capacitor and being characterized by current substantially flowing through a calibration resistor; and
   detecting the resistance change in the connector based on the first transient response and the second transient response.

20. The method of claim 19 further comprising:
   indicating an error if the ratio of the first and second transient responses exceeds a predetermined threshold.

21. A device for detecting a resistance change of a connector as seen by a control circuit looking into the connector connecting a remote circuit to the control circuit, the device comprising:
   a unidirectional current element electrically connected in parallel with the remote circuit, the unidirectional current element and the remote circuit being coupled to the control circuit via the connector;
   a non-linear passive circuit element in the control circuit coupled to the remote circuit and the unidirectional current element via the connector to form an RC circuit including at least the remote mounted sensor net, the connector, and the capacitor;
   a calibration element coupled to the non-linear passive circuit element;
   a microcontroller coupled to the connector, the calibration element and the non-linear passive circuit element and being further coupled to the unidirectional current element and the remote sensor via the connector, the microcontroller being configured to:
      detect a first response time of a first transient signal in the RC circuit and resulting from transient current flowing substantially through the connector and the unidirectional current element,
      detect a second response time of a second transient signal across the non-linear passive circuit element and resulting from transient current flowing through the calibration element,
      determine a ratio of the first response time to the second response time, and compare the ratio to a predetermined threshold to detect a derogation in the connector.

22. The device of claim 21 wherein the microcontroller is further configured to provide a signal if the ratio exceeds the predetermined threshold.

* * * * *

UNITED STATES PATENT AND TRADEMARK OFFICE
CERTIFICATE OF CORRECTION

PATENT NO. : 6,198,295 B1
DATED : March 6, 2001
INVENTOR(S) : Bruce Lyman Hill

Page 1 of 1

It is certified that error appears in the above-identified patent and that said Letters Patent is hereby corrected as shown below:

<u>Title page,</u>
The inventor's name, "Bruch" should read -- Bruce --.

<u>Column 7,</u>
Line 40, move "R" to the beginning of line 41.
Line 64, "preferably" should read -- preferable --.

Signed and Sealed this

Nineteenth Day of March, 2002

Attest:

JAMES E. ROGAN
Director of the United States Patent and Trademark Office

Attesting Officer